United States Patent [19]

Nuwayser

[11] Patent Number: 5,265,231

[45] Date of Patent: Nov. 23, 1993

[54] REFRESH CONTROL ARRANGEMENT AND A METHOD FOR REFRESHING A PLURALITY OF RANDOM ACCESS MEMORY BANKS IN A MEMORY SYSTEM

[75] Inventor: Sami H. Nuwayser, Newton, Mass.

[73] Assignee: Thinking Machines Corporation, Cambridge, Mass.

[21] Appl. No.: 652,801

[22] Filed: Feb. 8, 1991

[51] Int. Cl.⁵ .......................... G06F 12/02; G11C 7/00
[52] U.S. Cl. .................................. 395/425; 365/222; 365/230.03; 364/DIG. 1; 364/243.1
[58] Field of Search .......................... 395/425, 400; 364/200 MS File, 900 MS File; 365/222, 230.03

[56] References Cited

U.S. PATENT DOCUMENTS

| | | | |
|---|---|---|---|
| 4,106,108 | 8/1978 | Cislaghi et al. | 365/222 |
| 4,112,513 | 9/1978 | Elsner | 365/222 |
| 4,185,323 | 1/1980 | Johnson et al. | 365/222 |
| 4,249,247 | 2/1981 | Patel | 395/425 |
| 4,333,167 | 6/1982 | McElroy | 365/222 |
| 4,357,686 | 11/1982 | Scheuneman | 365/222 |
| 4,376,988 | 3/1983 | Ludwig et al. | 365/222 |
| 4,601,018 | 7/1986 | Baum et al. | 365/230.04 |
| 4,631,701 | 12/1986 | Kappeler et al. | 365/222 |
| 4,691,303 | 9/1987 | Churchward et al. | 365/222 |
| 4,700,330 | 10/1987 | Altman et al. | 365/222 |
| 4,723,204 | 2/1988 | Khera | 365/222 |
| 4,757,217 | 7/1988 | Sawada et al. | 307/480 |
| 4,796,232 | 1/1989 | House | 365/189.03 |
| 4,860,252 | 8/1989 | Sykora | 364/900 |
| 4,887,240 | 12/1989 | Garverick et al. | 365/189.04 |
| 4,907,199 | 3/1990 | Dosaka et al. | 365/189.04 |
| 4,912,678 | 3/1990 | Mashiko | 365/222 |
| 4,914,630 | 4/1990 | Fujishima et al. | 365/189.04 |
| 4,958,322 | 9/1990 | Kasugi et al. | 365/189 |
| 4,967,397 | 10/1990 | Walck | 365/222 |
| 4,984,209 | 1/1991 | Rajaram et al. | 365/222 |
| 4,989,183 | 1/1991 | Kumanoya et al. | 365/222 |
| 5,089,987 | 2/1992 | Nakao et al. | 365/222 |

Primary Examiner—Joseph L. Dixon
Assistant Examiner—Hiep T. Nguyen
Attorney, Agent, or Firm—Richard A. Jordan

[57] ABSTRACT

A memory controller and a method for controlling a memory including at least one memory bank including a plurality of storage locations. The memory controller receives memory access requests over a bus in a digital computer system and, in response initiates a memory access operation in connection with a storage location. The memory controller comprises a memory access control circuit that receives memory access requests over the bus and for performing a memory access operation in connection with a storage location in response thereto. A memory refresh control circuit includes a yellow refresh control circuit and a red refresh control circuit, both of which control refresh of the memory bank(s). The yellow refresh control circuit initiates a refresh operation in connection with a memory bank while the memory access control circuit is performing a memory access operation. In that connection, the yellow refresh control circuit initiates a refresh operation in connection with a memory bank other than the bank with respect to which the memory access control circuit is performing a memory access operation. The red refresh control circuit, on the other hand, initiates a refresh operation in connection with at least one memory bank and concurrently disables said memory access control circuit from performing a memory access operation.

12 Claims, 5 Drawing Sheets

DRAM CONTROL SIGNAL GENERATOR 43 (DRAS DCAS)

REFRESH CONTROL ARRANGEMENT AND A METHOD FOR REFRESHING A PLURALITY OF RANDOM ACCESS MEMORY BANKS IN A MEMORY SYSTEM

FIELD OF THE INVENTION

The invention relates generally to the field of digital computer systems, and more particularly to memory arrangements for storing and refreshing digital data.

BACKGROUND OF THE INVENTION

A computer system generally includes one or more processors, a memory and an input/output system. The memory stores data and instructions for processing the data. The processor(s) process the data in accordance with the instructions, and store the processed data in the memory. The input/output system facilitates loading of data and instructions into the system, and obtaining processed data from the system.

Modern memories provide a number of individually addressable storage locations in dynamic random access memories (DRAMs), with each addressable location comprising, for example, eight "bit" (for "binary digit") storage locations. The DRAMs are formed from a plurality of integrated circuit memory chips, with each memory chip storing one or several bits of a number of the eight-bit storage locations. Typically, storage locations on a DRAM chip are arranged in a storage array having a plurality of rows and columns. When a storage location is accessed, that is, when data is written thereto or read therefrom, an address is provided which is divided into a row address portion and a column address portion. Generally, signals representing the row address portion are coupled to address terminals on the memory chips along with a row address strobe ("RAS") signal which enables the chips to use the signals to identify the row of the storage array containing the bit storage locations to be accessed. A selected time thereafter, signals representing the column address portion are coupled to the address terminals, along with a column address strobe ("CAS") signal that enables the chips to use the signals to identify the column. The bit storage locations at the intersection of the identified row and column are written or read, depending on the condition of a write enable signal.

Each bit storage location of a DRAM is essentially a transistor having a large internal capacitance, with the presence of an electrical charge in the capacitance indicating, for example, the binary value "one," and the absence of a charge indicating the binary value "zero." Typically, when a storage location is read, the charge condition of the capacitance is destroyed, and the circuitry in the DRAM chip includes circuitry that restores the charge to its level prior to the read operation. Over time even in the absence of reading operations, the charge levels of the capacitances may decrease due to leakage. The charge levels must be restored, that is "refreshed," to maintain the integrity of the charge, and, accordingly, of the value, representing the data stored in the bit storage location. Therefore, memories which incorporate DRAM chips have refresh circuitry which enables the chips to be refreshed.

In the past, DRAM chips were refreshed by supplying address signals identifying a row of the storage array, along with the RAS signal. This essentially enabled the DRAM chips to read the entire row identified by the row address which enabled their refresh circuitry to refresh the entire row. Control circuitry, external to the DRAM chips, maintained a "refresh counter" which supplied the row address signals, and incremented between refresh operations to ensure that the rows were iteratively refreshed. The time between refreshes was established to ensure that all of the rows would be refreshed before leakage obliterated the data stored therein.

More recently, the DRAM chips have been developed which include the refresh counters. For those chips, refresh is enabled, by external control circuitry, by providing the RAS signal and the CAS signal in reverse order, that is, by providing the CAS signal a selected time before the RAS signal. The DRAM chips, upon receiving the CAS and RAS signals in that manner, refresh the particular rows identified by their respective refresh counters.

SUMMARY OF THE INVENTION

The invention provides a new and improved memory system, including in particular a new memory controller, for controlling refresh of DRAM memory chips.

In brief summary, the new memory controller controls a memory including at least one memory bank including a plurality of storage locations. The memory controller receives memory access requests over a bus in a digital computer system and, in response initiates a memory access operation in connection with a storage location. The memory controller comprises a memory access control circuit that receives memory access requests over the bus and for performing a memory access operation in connection with a storage location in response thereto. A memory refresh control circuit includes a yellow refresh control circuit and a red refresh control circuit, both of which control refresh of the memory bank(s). The yellow refresh control circuit initiates a refresh operation in connection with a memory bank while the memory access control circuit is performing a memory access operation. In that connection, the yellow refresh control circuit initiates a refresh operation in connection with a memory bank other than the bank with respect to which the memory access control circuit is performing a memory access operation. The red refresh control circuit, on the other hand, initiates a refresh operation in connection with at least one memory bank and concurrently disables said memory access control circuit from performing a memory access operation.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1:
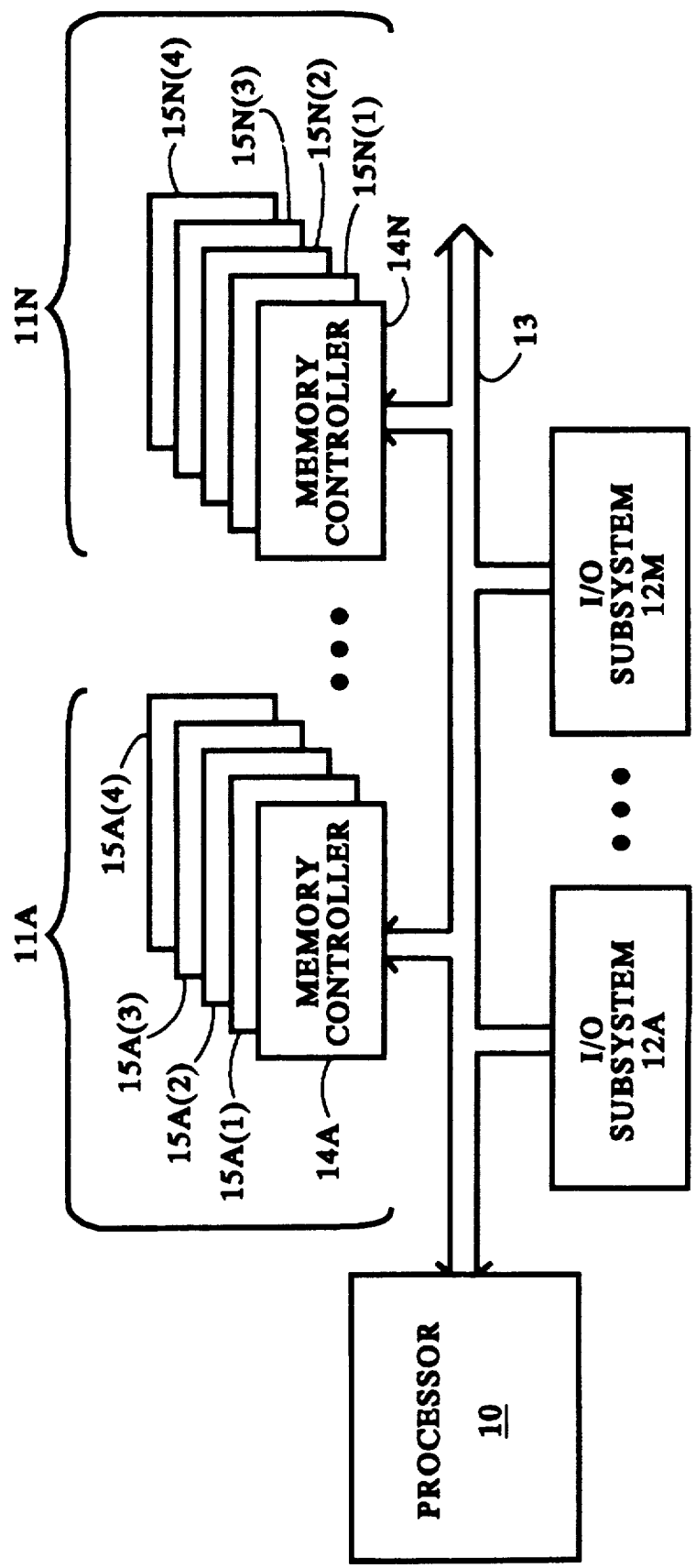
FIG. 1 depicts a general block diagram of a digital computer system including a memory controller constructed in accordance with the invention.

With reference to FIG. 1, a computer system which may advantageously incorporate this invention includes, as basic elements, a processor 10, one or more memory subsystems 11A through 11N (generally identified by reference numeral 11) and one or more input/output subsystems 12A through 12M (generally identified by reference numeral 12). A system bus 13 interconnects the processor 10, memory subsystems 11 and input/output subsystems 12 in parallel. The processor 10 executes instructions that are stored in addressable storage locations in the memory subsystems 11. The instructions identify operations that are to be performed on operands, which are also stored in addressable storage locations in the memory subsystems. The instructions and operands are fetched by the processor 10 as they are needed, and processed data are returned to the memory subsystems 11.

The processor 10 also transmits control information and data to the input/output subsystems 12, enabling them to perform selected operations. Input/output subsystems may include such types of subsystems as, for example, video display terminals, printers or electronic display devices, and secondary storage subsystems such as disk or tape storage units. In addition, input/output subsystems 12 may include telephony or network interfaces to facilitate the transfer of information thereover. Some input/output subsystems 12 are direct memory access ("DMA") devices, which may, in accordance with the control information that they receive, retrieve data from a memory subsystem or transfer data to a memory subsystem 11 for storage therein. Other input/output subsystems may not be DMA devices, in which case another device connected to bus 13, such as the processor 10, provides the information thereto or receives it therefrom.

Figure 2:
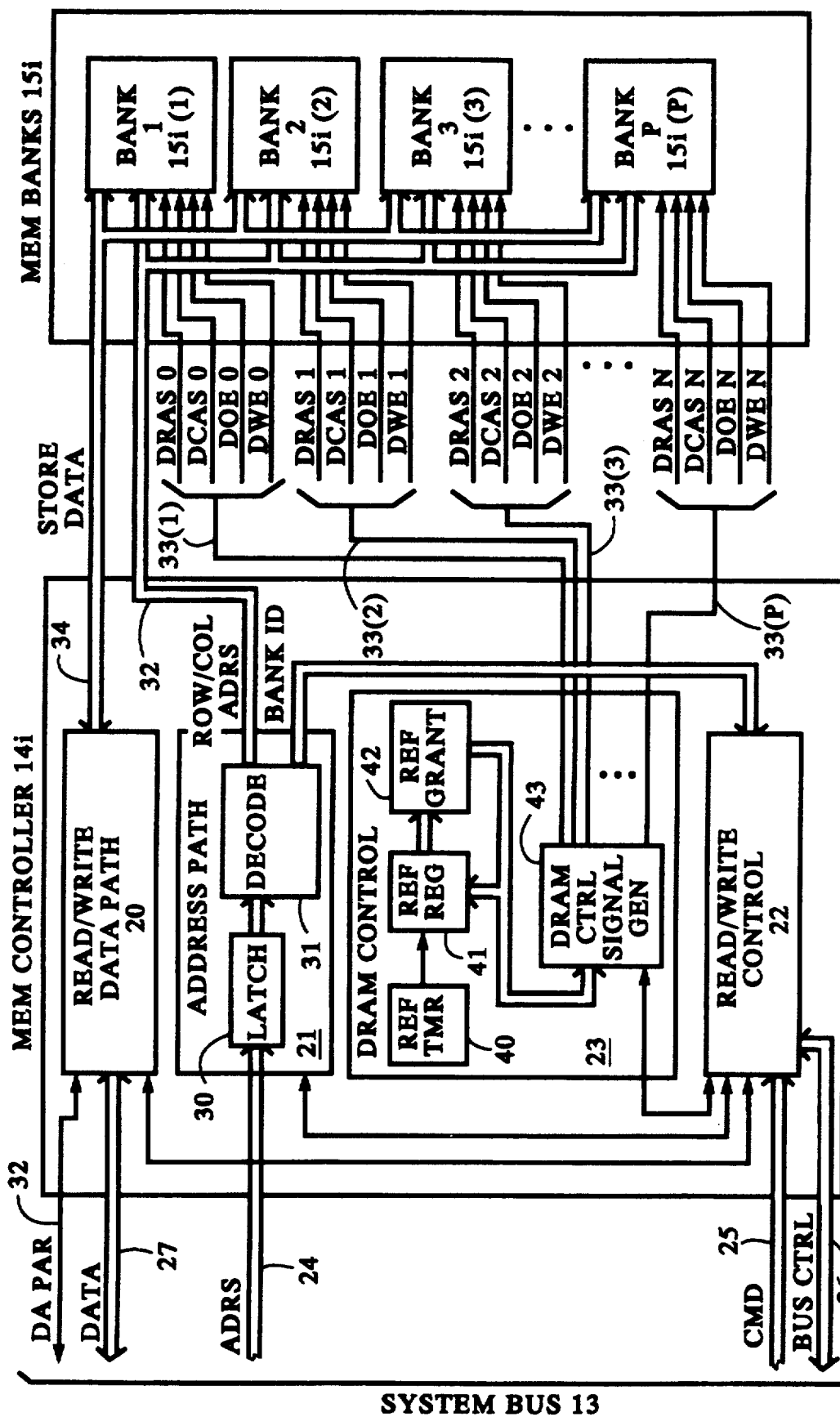
FIG. 2 depicts a functional block diagram of a memory controller depicted in FIG. 1.

Each memory subsystem 11 includes a memory controller, generally identified by reference numeral 14, and one or more memory banks, generally identified by reference numeral 15. A block diagram of a controller 14$i$ and memory banks 15$i$ of one memory subsystem 11$i$ is depicted generally in FIG. 2. While each memory subsystem 11 depicted in FIG. 1 is depicted as having four memory banks, it will be appreciated that a memory subsystem 11$i$ may have any number of memory banks; the memory subsystem 11$i$ depicted in FIG. 2 is shown as having "P" memory banks 15$i$(1) through 15$i$(P) (generally identified by reference numeral 15$i$). Generally, the memory banks 15$i$ comprise DRAM memory chips which contain the storage arrays for storing the data, instructions and processed data.

The controller 14$i$ connects to the system bus 13, and receives ADRS address signals over address lines 25, CMD transfer command signals over command lines 25 and BUS CTRL bus control signals over bus control lines 26. From the CMD command signals, in particular, the memory controller 14$i$ determines the type of a memory access operation to be performed, that is, whether data is to be stored in, or retrieved from, a storage location in the memory banks 15 identified by the ADRS address signals.

If the CMD command signals received over bus 13 indicate a data storage operation, the data is also provided as DATA data signals over data lines 27. The memory controller 14$i$ uses the contemporaneously-received ADRS address signals to determine whether the data is to be stored in a storage location in one of its memory banks 15$i$. If so, the memory controller 14$i$ receives the DATA data signals and enables the data represented thereby to be stored in the appropriate storage location. On the other hand, if the CMD command signals initiate a retrieval of data, and if the ADRS address signals identify a storage location in one of its memory banks 15$i$, the memory controller 14$i$ initiates a read operation with the memory bank containing the storage location identified by the address signals to retrieve the data, and transmits DATA data signals over the system bus 13 representing the retrieved data.

With particular reference to FIG. 2, the memory controller 14$i$ includes a read/write data path circuit 20, an address path circuit 21, a read/write control circuit 22 and a DRAM control circuit 23. The read/write control circuit 22 controls all operations of the memory controller 14$i$, under control of the CMD command and BUS CTRL bus control signals from the system bus 13 as well as other signals from other components of the memory controller as described below. The BUS CTRL bus control signals include such signals as may be used to identify particular types of signals on the respective lines of bus 13, and their timing. For example, in the embodiment described herein, system bus 13 includes lines 24 through 27 for carrying the DATA, ADRS address and CMD command signals, and the BUS CTRL bus control signals will include a timing signal to indicate when the other signals are valid. In that embodiment, the read/write control circuit 22 will receive the timing signal and, in response thereto, latch the CMD command signals and enable the address path 21 to latch the ADRS address signals. Contemporaneously, if the CMD command signals indicate a write operation, the read/write control circuit 22 will enable the read/write data path to latch the DATA signals, which comprise the data to be written.

The address path circuit 21 includes a latch circuit 30 that receives and latches the ADRS address signals from address lines 24 of the system bus 13, and an address decoder 31. The address decoder 31 decodes the ADRS address signals latched in latch 30 to determine whether they identify a storage location in the memory banks 15$i$. Typically, the address signals comprise a high-order portion that identifies a particular subsystem connected to the system bus 13, and a low-order portion. If the high-order portion of the address signals identify the memory sub-system 11$i$, the low-order portion comprises bank identification, and the address of a storage location within the identified memory bank 15$i$. Accordingly, when the address decoder 31 determines that the high-order portion of the address signals in latch 30 identify the memory 11$i$, it notifies the read/write control circuit 22, and provides BANK ID bank identification signals, which it couples to the read/write control circuit 22, that identify the particular one of the banks 15$i$ which includes the storage location to be accessed.

In addition, the address path decoder 31 couples ROW/COL ADRS row/column address signals onto lines 32, which are connected in parallel to address terminals of the memory banks 15$i$. The storage locations within a memory bank 15$i$ are arranged in the form of an array comprising a plurality of rows and columns. The address of a storage location within a memory bank 15$i$ includes a row address portion and a column address portion, which the decoder 31 successively transmits over lines 32 to the memory banks 15i. The DRAM control circuit 23, also under control of the read/write control circuit 22, contemporaneously generates memory bank control signals over respective control lines, identified by reference numeral 33(j), to enable the one memory bank 15i(j), that is identified by the BANK ID bank identification signals, to use the signals on lines 32 and engage in the storage or retrieval operation.

The read/write data path 20, under control of the read/write control circuit 22, receives and latches the DATA signals from data lines 27 of system bus 13 when the CMD command signals indicate a write operation. Accompanying the data signal is a DA PAR data parity signal on line 32, which the read/write data path 20 uses in detecting errors in transmission of the data signals over the bus. If the read/write data path 20 determines from the DATA and DA PAR signals that the data signals were received without error, it also generates an error correction and detection code that is concatenated to the data from lines 27 of bus 13 and the combination transmitted as STORE DATA signals over lines 34. The STORE DATA signals, like the ROW/COL ADRS row/column address signals on lines 32, are coupled in parallel to all of the memory banks 15i, and the memory bank control signals on DRAM control lines 33(j) enable the one memory bank 15i(j), that is identified by the BANK ID bank identification signals, to use them signals in a storage operation.

During a retrieval operation, the decoder 31 transmits the ROW/COL ADRS row and column address signals over lines 32 in the same manner as during a storage operation. However, the DRAM control circuit 23 transmits DRAM control signals on one of lines 33(j) to enable the one memory bank 15i(j) that is identified by the BANK ID bank identification signals to transmit the contents of the identified storage location as STORE DATA signals onto lines 34. The STORE DATA signals includes the error correction and detection signals, and the read/write data path includes a check circuit that uses them to determine whether the data has been corrupted while it was stored. If the data has been corrupted, the check circuit attempts to correct it. If it is able to correct the stored data, the read/write control circuit 22 enables the read/write data path 20 to transmit the data as DATA signals over lines 27. If, on the other hand, the check circuit is unable to correct the corrupted data, the read/write control circuit 22 initiates selected operations, include, for example, notifying the processor 10 (FIG. 1) of the uncorrectable error.

As noted above, the DRAM control circuit 23 generates DRAM control signals that it transmits over lines 33(j) to control a particular memory bank 15i(j) identified by the BANK ID bank identification signals during a storage or retrieval operation. In addition, the DRAM control circuit 23 generates the DRAM control signals to initiate refresh operations in the respective memory banks 15i. The DRAM control circuit 23 initiates refresh operations in two general operating modes. One mode, which is identified in the following as a "yellow" refresh mode, is maintained if the timing between accesses of the memory 11i is sufficiently small. In the yellow refresh mode, the DRAM control circuit 23 enables a refresh operation with a memory bank 15i(j) while performing a storage or retrieval operation with another memory bank 15i(k), essentially as a background operation. In that case, the refresh operations do not interfere with accessing of the memory by, for example, the processor 10 or an input/output subsystem 12.

An alternative mode, which is identified herein as a "red" refresh mode, is maintained if the timing between accesses is to great. In the red refresh mode, the DRAM control circuit 23 enables refresh operations with multiple memory banks 15i, and delays subsequently received storage or retrieval operations until the refresh operation is completed.

In one embodiment, in either the yellow refresh mode or the red refresh mode the DRAM control circuit at any one time enables refresh operations and storage or retrieval operations in connection with fewer than all of the memory banks 15i. This is done to reduce the fluctuations in electrical power requirements that may be initiated as a result of the refresh operations and the storage and retrieval operations. In particular, it will be appreciated that refresh operations and storage and retrieval operations all initiate flow of electric current through the DRAMs comprising the memory banks 15i. In computer systems which have large amounts of memory, if all of the banks were accessed or refreshed at once the current flows initiated by such operations would be substantial, which may, in turn, require provision of substantial amounts of power during those relatively brief periods of time. To reduce such power fluctuations, not all banks 15i are refreshed at once.

In particular, in one embodiment, in which each memory 11i has four memory banks 15i, in the yellow refresh mode only one memory bank 15i is refreshed, so that, including the one bank that is engaging in the storage or retrieval operation, the DRAM control circuit 23 is enabling memory operations in two memory banks. In the same embodiment, in the red refresh mode, two memory banks are refreshed. However, since in the red refresh mode no storage or retrieval operation occurs with any of the memory banks 15i, the DRAM control circuit 23 enables memory operations with only two memory banks 15i, the same number as in the yellow refresh mode. The refresh timing is controlled so that all of the storage locations in all of the memory banks 15i will be refreshed before any degradation occurs in the data stored therein.

To accommodate refresh as described above, the DRAM control circuit 23 includes a refresh timer 40, a refresh register circuit 41, a refresh grant circuit 42 and a DRAM control signal generator 43. The detailed logic of each of these elements will be described in connection with FIGS. 3 through 5. Generally, the refresh register circuit 41 maintains a flag for each of the memory banks 15i(j) for each of the refresh modes, effectively maintaining a set of yellow refresh flags, identified below generally by reference numeral 62(j), each associated with a memory bank 15i(j), and a set of red refresh flags, identified below generally by reference numeral 63(j), each associated with a memory bank 15i(j).

Each refresh flag 62(j) and 63(j) identifies the refresh state of the associated memory bank 15i(j) so that, if the yellow refresh flag 62(j) associated with a memory bank 15i(j) is set, the bank may be refreshed during the next memory access. If yellow refresh flags associated with multiple memory banks 15i are set, one of the memory banks is refreshed, the memory bank being selected by the refresh grant circuit 42 according to a priority arrangement.

On the other hand, if a red refresh flag 63(j) is set, refresh occurs with respect to the memory bank associated with the set red refresh flags. In addition, if multiple red refresh flags are set, at most two of the associated memory banks 15i are refreshed, the memory banks being selected by the refresh grant circuit 42 according to a priority arrangement. If fewer than all memory banks with set red refresh flags are refreshed, multiple refreshes occur with the memory banks being refreshed at any point in time being selected by the refresh grant circuit according to the priority arrangement.

The refresh timer 40 asserts a refresh timing signal at the end of a predetermined timing interval, which is selected to ensure that the period between refreshes is sufficiently memory banks 15i are refreshed. The refresh register circuit 41 uses the refresh timing signal to update the red and yellow refresh flags associated with the respective memory banks 15i(j). That is, if neither the yellow refresh flag 62(j) nor the red refresh flag 63(j) associated with a particular memory bank 15i(j) are set, when the refresh timer 40 times out the bank's yellow refresh flag 62(j) is set. If the memory bank 15i(j) is refreshed before the refresh timer again times out, the bank's yellow refresh flag 62(j) is reset, and will be set again when the refresh timer again times out. On the other hand, if the memory bank 15i(j) is not refreshed before the refresh timer 40 again times out, the bank's red refresh flag 63(j) is set to initiate an immediate refresh. It will be appreciated that, as described above, if the red refresh flags associated with multiple memory banks 15i(j) are set, refresh of a memory bank may be delayed according to the priority arrangement maintained by the refresh grant circuit 42.

The DRAM control signal generator 43 generates the memory bank control signals and transmits them over respective control lines 33(j) to control operations by the respective memory banks 15i(j). The memory bank control signals transmitted to each memory bank 15i(j) comprise a DRAS "j" row address signal, a DCAS "j" column address signal, a DOE "j" output enable signal and a DWE "j" write enable signal, all coupled over lines 33(j) to a particular memory bank 15i(j). If data is being stored in or retrieved from a particular memory bank 15i(j), the read/write control circuit 22 enables the DRAM control signal generator 43 to assert the DRAS "j" and DCAS "j" with a particular timing to enable the memory bank 15i(j) to receive and use the ROW/COL ADRS row/column address signals on lines 32 as either the row address portion or the column address portion of the address signals.

If data is being stored in the memory bank 15i(j), the read/write control circuit 22 enables the DRAM control signal generator 43 to also assert the DWE "j" write enable signal to enable the memory bank 15i(j) to receive the STORE DATA signals from the lines 34 and store it in the location identified by the ROW/COL ADRS signals. On the other hand, if data is being retrieved from the memory bank 15i(j), the read/write control circuit enables the DRAM control signal generator to assert the DOE "j" output enable signal to enable the memory bank 15i(j) to transmit the data from the location identified by the ROW/COL ADRS signals onto the lines 34 as the STORE DATA signals.

The DRAM control signal generator 43 also operates in response to the conditions of the yellow and red refresh flags maintained by the refresh register circuit 41 to enable the memory banks 15i(j) to be refreshed. To enable refreshing of a particular memory bank 15i(j), the DRAM control signal generator 43 first asserts the bank's DCAS "j" signal, and a predetermined time later asserts its DRAS "j" signal. In the types of DRAM chips that form the memory banks of one particular embodiment of the memory 11i, this signal pattern, which may be generally termed "RAS before CAS," enables the memory bank 15i(j) to perform a refresh operation, refreshing one row of storage locations. In that embodiment, the memory bank 15i(j), or in particular each DRAM chip in the bank, maintains a pointer to identify the row to be refreshed. The pointer is incremented to point to each succeeding row for each subsequent refresh operation, thereby enabling all of the rows to be refreshed.

Figure 3:
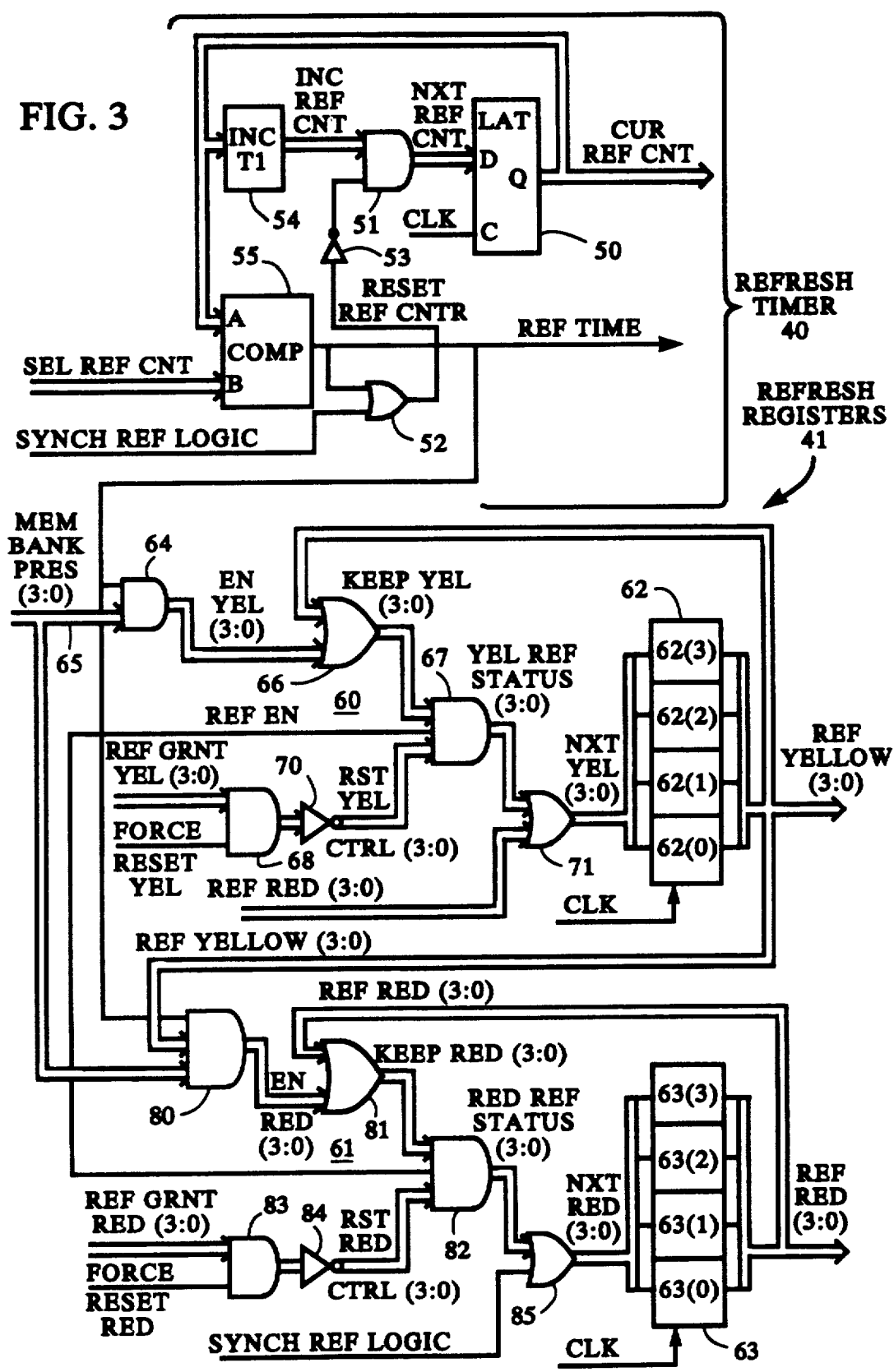
FIGS. 3 through 5 depict detailed schematic diagrams of circuits in the memory controller depicted in FIG. 2, which are useful in understanding the invention.
Figure 4:
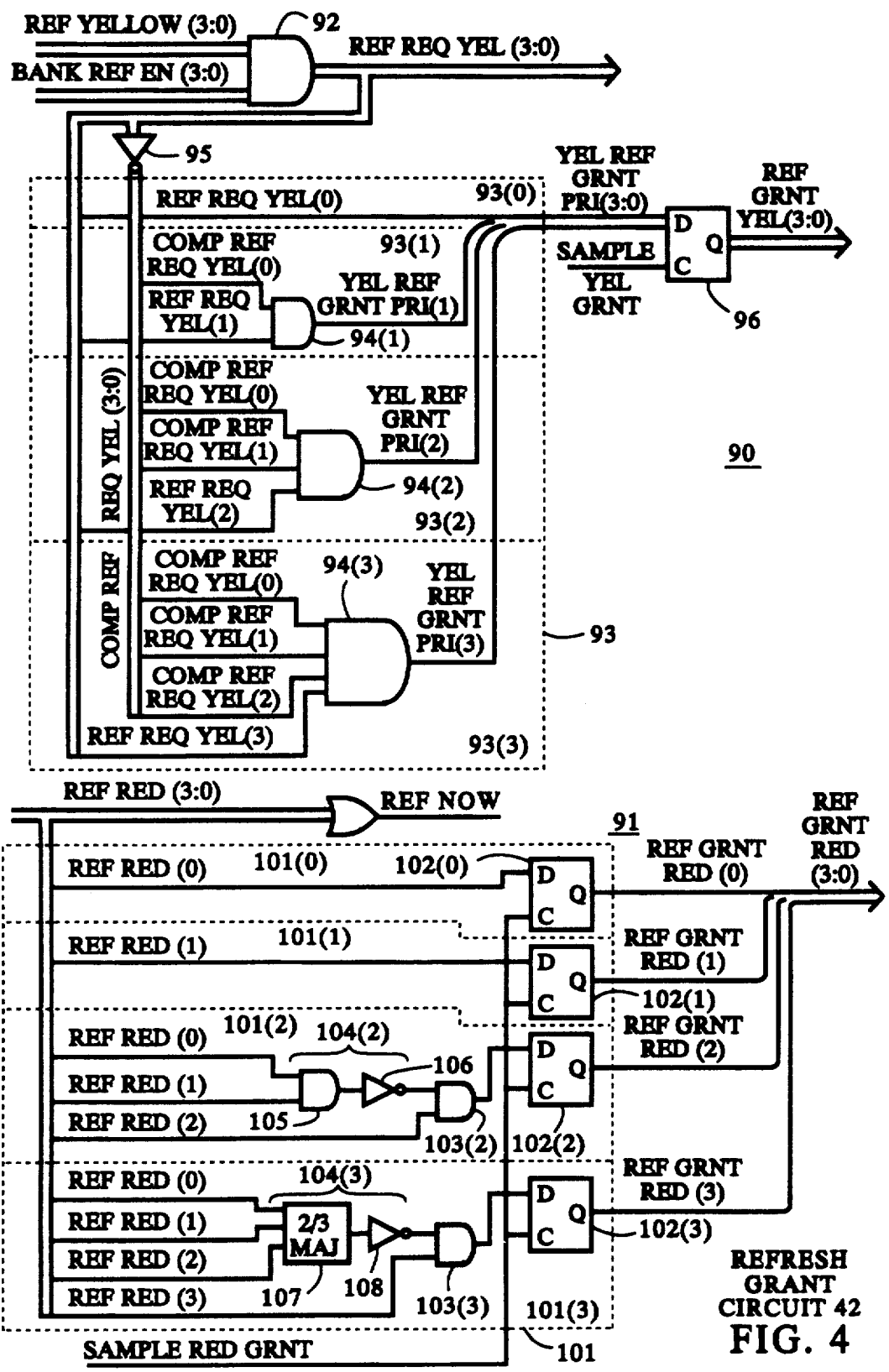
Figure 5:
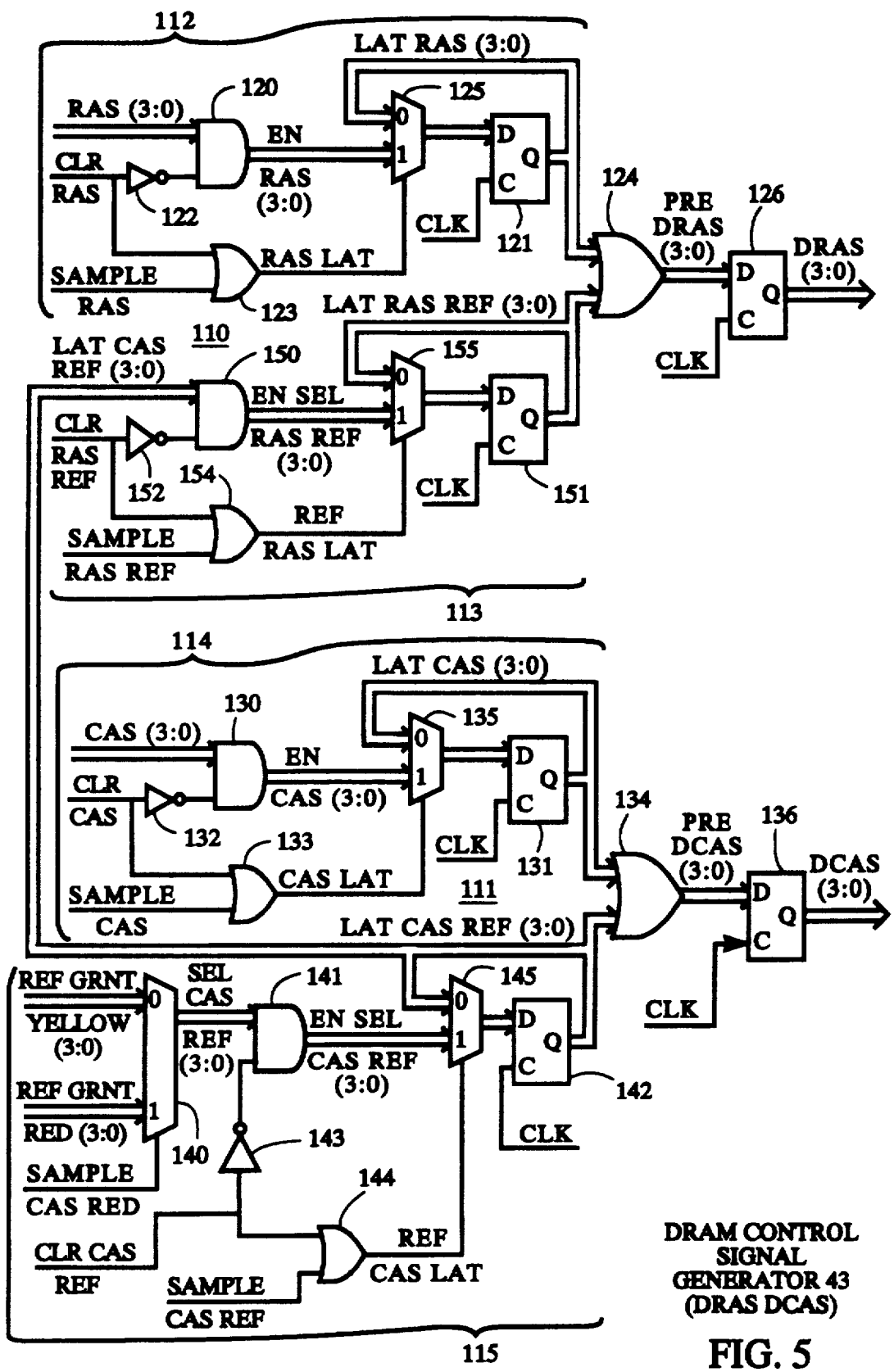

With this background, the detailed circuitry of the DRAM control circuit 23 will be described in connection with FIGS. 3 through 5. FIG. 3 depicts the detailed circuitry of the refresh timer 40 and refresh register circuit 41, while FIG. 4 depicts the detailed circuitry of the refresh grant circuit 42 and FIG. 5 depicts the detailed circuitry of the DRAM control signal generator 43.

With reference to FIG. 3, the refresh timer includes a latch 50 that provides updated CUR REF CNT current reference count signals that has a binary-encoded value indicating elapsed time in response to each subsequent tick of a CLK clock signal. The CLK signal is provided by the read/write control circuit 22 to synchronize operations of the various circuits comprising the memory controller 14i. In response to each tick of the CLK signal, the latch 50 latches NXT REF CNT next refresh count signals from a gated driver 51.

Initially, when a SYNCH REF LOGIC synchronize refresh logic signal from read/write control circuit 22 is asserted, an OR gate 52 is energized to assert a RESET REF CNTR reset refresh counter signal. The asserted RESET REF CNTR signal is complemented by an inverter 53, which disables the gated driver 51. When that occurs, all of the NXT REF CNT next refresh count signals are negated, so that the binary-encoded value of the NXT REF CNT signals are also zero. At the next tick of the CLK signal, the latch 50 latches the negated NXT REF CNT signals, and provides CUR REF CNT current refresh count signals all of which are negated thereby having a binary-encoded value of zero.

The CUR REF CNT current refresh count signals from latch 50 are coupled to an incrementation circuit 54, which generates in response INC REF CNT incremented refresh count signals, which have a binary-encoded value of one greater than the binary-encoded value of the CUR REF CNT current refresh count signals. The INC REF CNT signals are coupled to input terminals of the gated driver 51. If the SYNCH REF LOGIC signal is negated, and if a REF TIME refresh time signal is also negated, OR gate 52 is disabled, thereby negating the RESET REF CNTR reset refresh counter signal. As a result, the inverter 53 enables the gated driver 51, enabling the driver to couple the INC REF CNT increment refresh count signals as the NXT REF CNT next refresh count signals, which are latched by the latch 50 at the next tick of the CLK signal. Accordingly, as long as the OR gate 52 is deenergized and the RESET REF CNTR signal remains negated, the gated driver 51 remains enabled, in which case the binary-encoded value of the CUR REF CNT current refresh count signals increments at successive ticks of the CLK signal.

The CUR REF CNT current refresh count signals are also coupled to one input terminal of a comparator 55. The other input terminal receives SEL REF CNT selected refresh count signals. When the binary-encoded value of the CUR REF CNT signals corresponds to the binary-encoded value of the SEL REF CNT signals, the comparator asserts the REF TIME refresh time signal, which represents the timing out of the refresh timer as noted above. The asserted REF TIME signal energizes OR gate 52, causing it to assert the RESET REF CNTR reset refresh counter signal, causing inverter 53 to disable gated driver 51. The disabled gated driver 51, in turn, provides negated NXT REF CNT next refresh count signals, which are latched by the latch 50 at the next tick of the CLK signal. At that point, the CUR REF CNT current refresh count signals provided by latch 50 will also have the binary-encoded value of zero, so that the timer is effectively reset.

Since the binary-encoded value of the CUR REF CNT signals is then zero, which differs from the binary-encoded value of the SEL REF CNT selected refresh count signals, the comparator 55 negates the REF TIME refresh time signal. This disables the OR gate 52, causing it to negate the RESET REF CNTR reset refresh counter signal, which, in turn, enables the inverter 53 to enable the gated driver 51 to couple the INC REF CNT incremented reference count signals to the data input terminals of latch 50 as the NXT REF CNT next reference count signals. Thereafter, the latch 50 latches NXT REF CNT next refresh count signals, and thus provides CUR REF CNT current refresh count signals, with successively incremented binary-encoded values at successive ticks of the CLK signal, until the binary-encoded value of the CUR REF CNT current refresh count signals corresponds to the binary-encoded value of the SEL REF CNT selected refresh count signals.

The REF TIME refresh time signal is also coupled to the refresh register circuit 41, to a yellow flag conditioning circuit 60 and a red flag conditioning circuit 61. The yellow flag conditioning circuit 60, in turn, controls the conditioning of the yellow refresh flags 62(j), which are maintained by a latch 62, and the red flag conditioning circuit 61 controls conditioning of the red refresh flags 63(j), which are maintained by a latch 63. Generally, when the REF TIME signal is asserted, the yellow flag conditioning circuit 60 sets those yellow refresh flags that are associated with the memory banks 15i which are present in the memory subsystem 11i. If a yellow refresh flag 62(j) is set when the REF TIME signal is asserted, the red flag conditioning circuit 61 sets the red refresh flags that are associated with the memory banks 15i whose yellow refresh flags are then set.

More specifically, the assertion of the REF TIME signal enables a gated driver 64 in the yellow flag conditioning circuit 60. The gated driver 64 also receives MEM BANK PRES (3:0) memory bank present signals, each on one of four lines 65. As noted above, in the particular embodiment described herein, there are a maximum of four memory banks 15i. Each of the four memory banks 15i which may be present is associated with one of the four lines 65, so that, if the particular memory bank 15i(j) is present, its associated one of lines 65 is energized thereby effecting the assertion of its corresponding MEM BANK PRES (j) signal.

When the gated driver 64 is enabled by the assertion of the REF TIME refresh time signal, it asserts selected ones of EN YEL (3:0) enable yellow signals, each corresponding to an asserted one of the MEM BANK PRES (3:0) signals. The EN YEL (3:0) signals are coupled to one set of input terminals of an OR circuit 66. Accordingly, when the REF TIME signal is asserted, the ones of the EN YEL (3:0) enable yellow signals that are asserted correspond to the ones of the MEM BANK PRES (3:0) signals that are asserted, which, in turn, corresponds to the memory banks 15i(j) that are present in the memory 11i.

The OR circuit 66 receives the four EN YEL (3:0) enable yellow signals and four REF YELLOW (3:0) refresh yellow signals from flag latch 62 and generates KEEP YEL (3:0) keep yellow signals in response. The flag latch 62 maintains the four yellow refresh flags 62(j), each of which is associated with one of the memory banks 15i(j) and provides the REF YELLOW (3:0) refresh yellow signals. The OR circuit 66 asserts one of the KEEP YEL (j) signals if either the EN YEL (j) signal or REF YELLOW (j) signal is asserted.

The KEEP YEL (3:0) signals are coupled to one set of input terminals of a gated coincidence circuit 67. The gated coincidence circuit 67 also has a second set of input terminals which receive RST YEL CTRL (3:0) reset yellow control signals, and an enable input terminal that receives a REF EN refresh enable signal. The REF EN refresh enable signal is controlled by a control register (not shown) maintained by the read/write control circuit 22, which, in turn, is controlled by the processor 10. The processor 10 may load the control register so as to enable assertion or negation of the REF EN signal. If the processor 10 enables the REF EN refresh enable signal to be asserted, the DRAM control signal generator 43 to enables the memory banks 15i to refresh, but if it enables the REF EN refresh signal to be negated, refresh is inhibited.

The gated coincidence circuit 67 receives the RST YEL CTRL (3:0) reset yellow control signals from a reset control circuit, comprising a gated driver 68 and an inverter 70, that controls resetting of a yellow refresh flag 62(j) in latch 62 after its associated memory banks 15i(j) have been refreshed. The gated driver receives REF GRNT YEL (3:0) refresh grant yellow signals from the refresh grant circuit 42 (FIG. 2). The REF GRNT YEL (3:0) signals comprise four signals, each associated with one of the memory banks 15i(j). The refresh grant circuit 42 asserts a particular one REF GRNT YEL (j) signal, to enable the DRAM control signal generator 43 to enable the corresponding memory bank 15i(j) to refresh while it is enabling a memory access with another memory bank 15i(k).

When the read/write control circuit is asserting a FORCE RESET YEL force reset yellow signal, the gated driver 68 couples the REF GRNT YEL (3:0) signals to inverter 70, which complements them to provide the RST YEL CTRL (3:0) reset yellow control signals. Thus, if a REF GRANT YEL (j) refresh grant yellow signal is negated, indicating that the memory bank 15i(j) is not being refreshed, the corresponding RST YEL CTRL (j) reset yellow control signal is asserted. However, if the REF GRANT YEL (j) refresh grant yellow signal is asserted, indicating that the memory bank 15i(j) is being refreshed, the corresponding RST YEL CTRL (j) reset yellow control signal is negated.

The coincidence circuit 67 generates four YEL REF STATUS (3:0) yellow refresh status signals, each of which is also associated with a memory bank 15i(j). If the REF EN refresh enable signal is asserted, the coincidence circuit 67 generates each YEL REF STATUS (j) signal as the coincidence of the KEEP YEL (j) keep yellow signal and the DIS YEL (j) disable yellow signal. Thus, while the REF EN signal is asserted, if a KEEP YEL (j) keep yellow signal is asserted, indicating that the yellow refresh flag 62(j) associated with memory bank 15i(j) is set or to be set, and if the RST YEL CTRL (j) reset yellow control signal associated with the memory bank 15i(j) is asserted, indicating that the memory bank 15i(j) is not being refreshed, the coincidence circuit 67 asserts the corresponding YEL REF STATUS (j) yellow refresh status signal. On the other hand, if either a KEEP YEL (j) keep yellow signal is negated, indicating that the yellow refresh flag 62(j) associated with memory bank 15i(j) is not set or to be set, or if the RST YEL CTRL (j) reset yellow control signal associated with the memory bank 15i(j) is negated, indicating that the memory bank 15i(j) is to be refreshed, the coincidence circuit 67 negates the corresponding YEL REF STATUS (j) yellow refresh status signal.

The YEL REF STATUS (3:0) yellow refresh status signals are coupled to one set of input terminals of an OR circuit 71. The OR circuit 71 also has a second set of input terminals that receive REF RED (3:0) refresh red signals from the latch 63, and in response generates four NXT YEL (3:0) next yellow signals. A REF RED (j) signal is asserted if the red refresh flag 63(j), maintained by latch 63 and associated with a particular memory bank 15i(j), is set. This provides that the yellow refresh flag 62(j) associated with a memory bank 15i(j) will remain set if the bank's red refresh flag 63(j) is also set.

Each of the NXT YEL (j) next yellow signals is connected to control the conditioning of the yellow refresh flag 62(j) of latch 62 associated with one of the memory banks 15i(j), and thus the asserted or negated condition of the associated REF YELLOW (j) refresh yellow signal, in response to the next tick of the CLK clock signal. At each tick of the CLK clock signal, if an NXT YEL (j) next yellow signal is asserted, the corresponding yellow refresh flag 62(j) in latch 62 is set, enabling the latch 62 to assert the REF YELLOW (j) signal. On the other hand, if the NXT YEL (j) next yellow signal is negated, the yellow refresh flag is cleared, enabling the latch 62 to assert the REF YELLOW (j) signal.

After a yellow refresh flag associated with a memory bank 15i(j) is set, it remains set at subsequent ticks of the CLK clock signal, to maintain the REF YELLOW (j) signal in an asserted condition, until the corresponding REF GRNT YEL (j) refresh grant yellow signal is asserted along with the FORCE RESET YEL force reset yellow signal. Each flag is maintained in a set condition by means of a feedback path provided through OR circuit 66, which, as noted above, maintains the corresponding KEEP YEL (j) keep yellow signal asserted if the REF YELLOW (j) refresh yellow signal is asserted. Thus, the yellow refresh flag 62(j) set, or is maintained in a set condition, with each tick of the CLK signal, if (a) the refresh timer 40 times out and the memory bank 15i(j) is present in the memory 11i, (b) the yellow refresh flag is currently set and the memory bank 15i(j) is not being refreshed, or (c) the red refresh flag associated with the memory bank 15i(j) is set.

The yellow refresh flag 62(j) associated with a memory bank 15i(j) may be reset if the bank 15i(j) is refreshed before the REF RED (j) refresh red signal associated with a memory bank 15i(j) is asserted. If the memory bank 15i(j) is thus refreshed, the REF GRNT YEL (j) refresh grant yellow signal is asserted by the refresh grant circuit 42, and the read/write control circuit 22 asserts the FORCE RESET YEL force reset yellow signal. When that occurs, the gated driver 68 enables the inverter 70 to negate the corresponding RST YEL CTRL (j) reset yellow control signal, which, in turn, enables the coincidence circuit 67 to negate the YEL REF STATUS (j) signal associated with the memory bank 15i(j). If the REF RED (j) refresh red flag is also negated, the OR circuit 71 negates the NXT YEL (3:0) next yellow signal, which is latched by latch 62 at the next tick of the CLK signal, resetting the yellow refresh flag 62(j) and negating the REF YELLOW (j) signal associated with the memory bank 15i(j).

The REF YELLOW (3:0) refresh yellow signals are coupled to the red flag conditioning circuit 61, as are the MEM BANK PRES (3:1) memory bank present signals and the REF TIME refresh time signal. The red flag conditioning circuit 62 operates in a manner generally similar to the operation of the yellow flag conditioning circuit 60. In particular, the signals are coupled to a gated coincidence circuit 80, which generates EN RED (3:0) enable red signals in response. When the gated coincidence circuit 80 is enabled by the assertion of the REF TIME refresh time signal, if the REF YELLOW (j) refresh yellow signal and MEM BANK PRES (j) memory bank present signal associated with a particular memory bank 15i(j) are asserted, the gated coincidence circuit 80 asserts a corresponding EN RED (j) enable red signal. Accordingly, when the REF TIME signal is asserted, the ones of the EN RED (3:0) enable red signals that are asserted correspond to the ones of the memory banks 15i(j) for which the yellow refresh flags were set in response to one timing out of the refresh timer 40, but which were not refreshed before refresh timer 40 again timed out.

The EN RED (3:0) enable red signals are coupled to one set of input terminals of an OR circuit 81. The OR circuit 81 receives the four EN RED (3:0) enable red signals and four REF RED (3:0) refresh red signals from flag latch 63 and generates KEEP RED (3:0) keep red signals in response. The red flag latch 63 maintains four flags, each of which is associated with one of the memory banks 15i(j) and provides the REF RED (3:0) refresh red signals. The OR circuit 81 asserts one of the KEEP RED (j) signals if either the EN RED (j) signal or REF RED (j) signal is asserted.

The KEEP RED (3:0) signals are coupled to one set of input terminals of a gated coincidence circuit 82. The gated coincidence circuit 82 also has a second set of input terminals which receive RST RED CTRL (3:0) reset red control signals, and an enable input terminal that receives the REF EN refresh enable signal. The gated coincidence circuit 82 receives the RST RED CTRL (3:0) reset red control signals from a reset control circuit, comprising a gated driver 83 and an inverter 84, that controls resetting of the red refresh flags 63(j) in latch 63 after corresponding memory banks 15i(j) have been refreshed. The gated driver 83 receives REF GRNT RED (3:0) refresh grant red signals from the refresh grant circuit 42 (FIG. 2). The REF GRNT RED (3:0) signals comprise four signals, each associated with one of the memory banks 15i(j). The refresh grant circuit 42 asserts particular REF GRNT RED (j) signals, to enable the DRAM control signal generator 43 to enable the corresponding memory banks 15$i(j)$ to refresh in a red refresh mode.

When the read/write control circuit 22 is asserting a FORCE RESET YEL force reset RED signal, the gated driver 83 couples the REF GRNT RED (3:0) signals to inverter 84, which complements them to provide the RST RED CTRL (3:0) reset red control signals. Thus, if a REF GRANT RED ($j$) refresh grant red signal is negated, indicating that the memory bank 15$i(j)$ is not being refreshed, the corresponding RST RED CTRL ($j$) reset red control signal is asserted. However, if the REF GRANT RED ($j$) refresh grant red signal is asserted, indicating that the memory bank 15$i(j)$ refreshed, the corresponding RST RED CTRL ($j$) reset red control signal is negated.

The coincidence circuit 82 generates four RED REF STATUS (3:0) red refresh status signals, each of which is also associated with a memory bank 15$i(j)$. If the REF EN refresh enable signal is asserted, the coincidence circuit 82 generates each RED REF STATUS ($j$) signal as the coincidence of the KEEP RED ($j$) keep red signal and the DIS RED ($j$) disable red signal. Thus, while the REF EN signal is asserted, if a KEEP RED ($j$) keep red signal is asserted, indicating that the red refresh flag 63($j$) associated with memory bank 15$i(j)$ is set or to be set, and if the RST RED CTRL ($j$) reset red control signal associated with the memory bank 15$i(j)$ is asserted, indicating that the memory bank 15$i(j)$ is not being refreshed, the coincidence circuit 82 asserts the corresponding RED REF STATUS ($j$) red refresh status signal. On the other hand, if either a KEEP RED ($j$) keep red signal is negated, indicating that the red refresh flag 62($j$) associated with memory bank 15$i(j)$ is not set or to be set, or if the RST RED CTRL ($j$) reset red control signal associated with the memory bank 15$i(j)$ is negated, indicating that the memory bank 15$i(j)$ is to be refreshed, the coincidence circuit 82 negates the corresponding RED REF STATUS ($j$) red refresh status signal.

The RED REF STATUS (3:0) red refresh status signals are coupled to one set of input terminals of an OR circuit 85. The OR circuit 85 also has a second set of input terminals all connected to receive the SYNCH REF LOGIC synchronize refresh logic signal from the read/write control circuit 22, and in response generates four NXT RED (3:0) next red signals, each of which is connected to control the conditioning of a red refresh flag 63($j$) of latch 63 associated with one of the memory banks 15$i(j)$. A NXT RED ($j$) next red signal is asserted if either the RED REF STATUS ($j$) signal associated with the same memory bank 15$i(j)$ is asserted, or if the SYNCH REF LOGIC signal is asserted. As noted above, the read/write control circuit asserts the SYNCH REF LOGIC signal to synchronize the refresh register circuit 44. The assertion of the SYNCH REF LOGIC signal results in the setting of all of the red refresh flags 63($j$) maintained by the latch 63.

As noted above, each NXT RED ($j$) next red signal is connected to control the conditioning of the red refresh flag 63($j$) of latch 63 associated with one of the memory banks 15$i(j)$, and thus the asserted or negated condition of the associated REF RED ($j$) refresh red signal, in response to the next tick of the CLK clock signal. At each tick of the CLK clock signal, if an NXT RED ($j$) next red signal is asserted, the corresponding red refresh flag 63($j$) in latch 63 is set, enabling the latch 63 to assert the REF RED ($j$) signal. On the other hand, if the NXT RED ($j$) next red signal is negated, the red refresh flag 63($j$) is cleared, enabling the latch 63 to assert the REF RED ($j$) signal.

After a red refresh flag 63($j$) associated with a memory bank 15$i(j)$ is set, it remains set at subsequent ticks of the CLK clock signal, to maintain the REF RED ($j$) signal in an asserted condition, until the corresponding REF GRNT RED ($j$) refresh grant red signal is asserted along with the FORCE RESET RED force reset red signal. Each flag 63($j$) is maintained in a set condition by means of a feedback path provided through OR circuit 81, which, as noted above, maintains the corresponding KEEP RED ($j$) keep red signal asserted if the REF RED ($j$) refresh red signal is asserted. Thus, the red refresh flag 63($j$) is set, or is maintained in a set condition, with each tick of the CLK signal, if (a) the yellow refresh flag is currently set and the memory bank 15$i(j)$ has not been refreshed, or (b) the red refresh flag associated with the memory bank 15$i(j)$ is set.

The red refresh flag 63($j$) associated with a memory bank 15$i(j)$ may be reset if the bank 15$i(j)$ is refreshed. If the memory bank 15$i(j)$ is thus refreshed, the REF GRNT RED ($j$) refresh grant red signal is asserted by the refresh grant circuit 42, and the read/write control circuit 22 asserts the FORCE RESET YEL force reset yellow signal. When that occurs, the gated driver 83 enables the inverter 84 to negate the corresponding RST RED CTRL ($j$) reset red control signal, which, in turn, enables the coincidence circuit 82 to negate the RED REF STATUS ($j$) signal associated with the memory bank 15$i(j)$. If the SYNCH REF LOGIC synchronize refresh logic signal is also negated, the OR circuit 85 negates the NXT RED (3:0) next red signal, which is latched by latch 63 at the next tick of the CLK signal, resetting the red refresh flag 63($j$) and negating the REF RED ($j$) signal associated with the memory bank 15$i(j)$.

The refresh grant circuit 42 receive the REF YELLOW (3:0) refresh yellow and REF RED (3:0) refresh red signals, and, in response, select one or two memory banks 15$i(j)$ to be refreshed. In selecting memory banks 15$i(j)$ to be refreshed, the refresh grant circuit 42 operates according to a priority arrangement. In one particular embodiment, the priority arrangement is fixed, according to the particular memory banks' index "j" in the memory 11$i$. In addition, the refresh grant circuit 42 generates a REF NOW refresh now signal if the refresh register circuit 41 is generating any of the REF RED (3:0) refresh red signals. The REF NOW refresh now signal is coupled to the read/write control circuit 22 to notify it that a refresh operation is to take place, in the red refresh mode.

The detailed circuit of the refresh grant circuit 42 is depicted in FIG. 4. With reference to FIG. 4, the refresh grant circuit 42 comprises two general sections, namely yellow refresh grant circuit 90 and red refresh grant circuit 91. The yellow refresh grant circuit 90 includes a coincidence circuit 92 that receives the REF YELLOW (3:0) refresh yellow signals from the refresh register circuit 41 and BANK REF EN (3:0) bank refresh enable signals from the read/write control circuit 22. The read/write control circuit 22 controls each BANK REF EN ($j$) signal to indicate whether the associated memory bank 15$i(j)$ is being accessed in response to a storage or retrieval request from the system bus 13 (FIG. 1). If the memory bank 15$i(j)$ is being accessed, the read/write control circuit negates the BANK REF EN ($j$) signal, and otherwise it asserts the signal.

In response to the REF YELLOW (3:0) refresh yellow signals and the BANK REF EN (3:0) bank refresh enable signal, the coincidence circuit 92 generates four REF REQ YEL (3:0) refresh request yellow signals, each associated with one of the memory banks 15i(j). In addition, an inverter 95 receives the four REF REQ YEL (3:0) signals, and generates, in response COMP REF REQ YEL (3:0) complement refresh request yellow signals, with each COMP REF REQ YEL (i) signal being the complement of the corresponding REF REQ YEL (i) signal. The REF REQ YEL (3:0) and COMP REF REQ YEL (3:0) signals are coupled to a priority circuit 93 that generates YEL REF GRNT PRI (3:0) yellow refresh grant prioritized signals, at most one of which will be asserted to enable the associated memory bank 15i(j) to be refreshed.

The priority circuit 93 includes four stages 93(0) through 93(3), each generating one of the YEL REF GRNT PRI (3:0) signals. Stage 93(0) couples the REF REQ YEL (0) signal as the YEL REF GRNT PRI (0) signal. Each of the other stages 93(1) through 93(3) includes an associated one of AND gates 94(1) through 94(3) that generate the YEL REF GRNT PRI (1) through YEL REF GRNT PRI (3) signals. Each AND gate 94(j) receives the REF REQ YEL (j) signal and the COMP REF REQ YEL (j−1) through COMP REF REQ YEL (0) signals provided by inverter 95 and generates a YEL REF GRNT PRI (j) yellow refresh grant priority signal in response. Thus, if the REF REQ YEL (j) refresh request yellow signal associated with a memory bank 15i(j) is asserted, and if the corresponding signals associated with the memory banks of lower index "j" are not asserted, as indicated by the assertion of the COMP REF REQ YEL (j−1) through COMP REF REQ YEL (0) signals, the and gate 94(j) is energized to assert the YEL REF GRNT PRI (j) signal.

On the other hand, if an REF REQ YEL (k) signal ("k" being an index between zero and "j−1, inclusive) is asserted, the corresponding COMP REF REQ YEL (k) signal is also negated, which disables the AND gates 94(k+1) through 94(3) so that the YEL REF GRNT PRI (k+1) through YEL REF GRNT PRI (k+1) through YEL REF GRNT PRI (3) signals will be negated. Thus, even if a REF REQ YEL (j) signal is asserted, if the REF REQ YEL (k) signal (where "k" is less than "j") is also asserted the AND gate 94(j) will be disabled to prevent assertion of the YEL REF GRNT PRI (j) signal.

The latch 96 latches the YEL REF GRNT PRI (3:0) yellow refresh grant priority signals from priority circuit 93 in response to a tick of a SAMPLE YEL GRNT sample yellow grant signal from read/write control circuit 22. The latch 96 provides the latched signals as REF GRNT YEL (3:0) refresh grant yellow signals, each associated with one of the memory banks 15i(j). The REF GRNT YEL (3:0) signals are coupled to the DRAM control signal generator 43 to control refreshing, and also to the refresh register circuit 41 to control resetting of the yellow refresh flags 62(j). The read/write control circuit 22 generates the SAMPLE YEL GRNT signal a predetermined time after it conditions the BANK REF EN (3:0) signals, the time being selected to enable priority circuit 93 to condition the appropriate YEL REF GRNT PRI (3:0) yellow refresh grant priority signals in response to the REF REQ YEL (3:0) signals.

The red refresh grant circuit 91 is generally similar to yellow refresh grant circuit 90. The red refresh grant circuit 91 includes an OR gate 100 that receives the REF RED (3:0) refresh red signals from the refresh register circuit 41, ORs them together and generates in response a REF NOW refresh now signal. The REF NOW signal is asserted if any of the REF RED (3:0) signals is asserted. The REF NOW signal is coupled to the read/write control circuit 22 to enable it to initiate a refresh operation in connection with one or at most two memory banks 15i(j) whose associated REF RED (j) signals are asserted.

The red refresh grant circuit 91 further includes a priority circuit 101 that receives the REF RED (3:0) refresh red signals and generates RED GRNT REF (3:0) red grant refresh signals in response. The priority circuit 101 includes four priority stages 101(0) through 101(3) [generally identified by reference numeral 101(j)], each of which receives the associated REF RED (j) signal and REF GRNT RED signals from the preceding stages and generates in response the corresponding RED GRNT REF (j) signal, enabling refresh to occur in a red refresh mode. The stages of the priority circuit 101 are established to ensure that at most two memory banks 15i(j) are refreshed at any one time.

More specifically, the REF RED (0) refresh red signal controls the condition of a flip-flop 102(0) in the priority stage 101(0). If the REF RED (0) signal is asserted, the flip-flop 102(0) is set in response to the next assertion of a SAMPLE RED GRNT sample red grant signal from the read/write control signal 22. If the flip-flop 102(0) is set, it asserts the REF GRNT RED (0) refresh grant red signal. Similarly, if the REF GRNT RED (1) signal is asserted, a flip-flop 102(1) is set when the SAMPLE RED GRNT signal is next asserted, enabling the REF GRNT RED (1) signal to be asserted. If either the REF RED (0) signal or the REF RED (1) signal is asserted when the SAMPLE RED GRNT signal is asserted, the flip-flop is clear and the corresponding REF GRNT RED (0) or REF GRNT RED (1) signal is negated.

The remaining stages 101(2) and 101(3) operate in response to the REF RED (2) and REF RED (3) signals, respectively, as well as the REF RED (0) and REF RED (1) signals of the preceding stages. In stage 101(2), the REF RED (2) signal controls one input terminal of an AND gate 103(2). The other input terminal of AND gate 103(2) is controlled by a priority network 104(2). The priority network 104(2) includes an AND gate 105 and an inverter 106. The AND gate 105 generates an asserted output signal if both the REF RED (0) and REF RED (1) signals are asserted, indicating that refresh operations are enabled, in the red refresh mode, with both memory banks 15i(0) and 15i(1). The asserted output signal from AND gate 105 is complemented by inverter 106 to disable AND gate 103(2) if both of the REF RED (0) and REF RED (1) signals are asserted. When that occurs, the AND gate 103(2) remains de-energized regardless of the condition of the REF RED (2) signal. This will ensure that flip-flop 102(2) will remain clear and the REF GRNT RED (2) refresh grant red signal will be negated, to disable refreshing of the memory bank 15i(2).

On the other hand, if a refresh operation, in the red refresh mode, is enabled with at most one of the memory banks 15i(0) or 15i(1), AND gate 105 will be disabled, generating a negated output signal. The inverter 106 complements the negated signal, thereby enabling AND gate 103(2), enabling it to generate an output signal that has the same asserted or negated condition as the REF RED (2) signal. If the REF RED (2) refresh red signal is also asserted, AND gate 103(2) is energized. Accordingly, if the REF RED (2) signal is asserted, and if a refresh operation in the red refresh mode is enabled with at most one of the memory banks 15i(0) or 15i(1), AND gate 103(2) is energized, which, in turn, enables the flip-flop 102(2) to be set when the SAMPLE RED GRNT sample red grant signal is asserted. When flip-flop 102(2) is set, the REF GRNT RED (2) refresh grant red signal is asserted to enable memory bank 15i(2) to be refreshed.

Similarly, in stage 101(3), the REF RED (3) signal controls one input terminal of an AND gate 103(3). The other input terminal of AND gate 103(3) is controlled by a priority network 104(3) that includes a two-of-three majority circuit 107 and an inverter 108. The two-of-three majority circuit 107 generates an asserted output signal if at least two of three REF RED (0) through REF RED (2) signals input thereto are asserted, and otherwise generates a negated output signal. The output signal from the two-of-three majority circuit is complemented by inverter 108, which disables AND gate 103(3) if two of the three REF RED (2:0) refresh red signals are asserted, and enables AND gate 103(3) if at most one of the REF GRNT RED (2:0) signals are asserted. Thus, if at least two of the REF RED (2.0) signals are asserted, priority network 104(3) will disable AND gate 103(3). In that condition, the AND gate 103(3) will be de-energized regardless of the condition of the REF RED (3) signal.

On the other hand, if the priority network 104(3) is enabling the AND gate 103(3), AND gate 103(3) generates an output signal that has the same asserted or negated condition as the REF RED (2) signal. In particular, if the REF RED (3) signal is asserted, the AND gate 103(3) will be energized, causing the flip-flop 102(3) to be set when the SAMPLE RED GRNT sample red grant signal is asserted. The set flip-flop 102(3) asserts the REF GRNT RED (3) refresh grant red signal, enabling the memory bank 15i(3) to be refreshed. However, if the REF RED (3) signal is negated, AND gate 103(3) will be de-energized, causing the flip-flop 102(3) to be clear when the SAMPLE RED GRNT sample red grant signal is asserted. The clear flip-flop 102(3) negates the REF GRNT RED (3) refresh grant red signal.

The read/write control circuit 22 generates the SAMPLE RED GRNT signal a predetermined time after it receives the asserted REF NOW refresh now signal. The time is selected to enable the corresponding signals to propagate to the input terminals of the respective flip-flops 102(0) through 102(3).

FIG. 5 depicts details of portions of the DRAM control signal generator 43 involved in generating the DRAS (3:0) and DCAS (3:0) signals. With reference to FIG. 5, the DRAM control signal generator 43 includes a RAS control section 110 and a CAS control section 111. The RAS control section 110 controls generation of the DRAS (3:0) signals, and the CAS control section 111 controls generation of the DCAS (3:0) signals, all of which are coupled to the memory banks 15i(j) on the control lines 33(j).

The RAS control section 110 includes a RAS access control portion 112 that controls generation of the respective DRAS (3:0) signals for a memory access operation in response to a memory request from the system bus 13, and a RAS refresh control portion 113 that controls generation of the DRAS (3:0) signals for a refresh operation, all in response to signals from the read/write control circuit 22 and the refresh grant circuit 42. Similarly, the CAS control section 111 includes a CAS access control portion 114 that controls generation of the respective DCAS (3:0) signals for a memory access operation, and a CAS refresh control portion 114 that controls generation of the DCAS (3:0) signals for a refresh operation.

To initiate an access operation, the read/write control circuit 22 (FIG. 2) enables the address path 21 (FIG. 2) to transmit the row portion of the address of the storage location to be accessed as ROW/COL ADRS row/column address signals over lines 32. In addition, the read/write control circuit 22 conditions the RAS (3:0) signals to assert the one, namely, the RAS(k) signal, associated with the memory bank 15i(k) to be accessed, and negates the others.

The RAS access control portion 112 includes a gated driver 120 that receives 22. To RAS (3:0) row address strobe signals from the read/write control circuit enable a memory access with a memory bank 15i(k), the read/write control circuit asserts one of the RAS (k) signals, negates a CLR RAS clear row address strobe signal and asserts a SAMPLE RAS sample row address strobe signal. In response to the negation of the CLR RAS signal, an inverter 122 enables the gated driver 120, which asserts one of the EN RAS (3:0) signals associated with the one asserted RAS (3:0) signal.

The EN RAS (3:0) signals, in turn, are coupled to the data input terminals of a multiplexer 135. The asserted SAMPLE RAS sample row address strobe signal energizes an OR gate 123 to assert an RAS LAT row address strobe latch signal. The RAS LAT signal controls the latch control terminal of the multiplexer 125. In particular, when the RAS LAT signal is asserted, the multiplexer 125 couples the EN RAS (3:0) enable row address strobe signals to data input terminals of a latch 121, which latches the EN RAS (3:0) enable row address strobe signals at the next tick of the CLK signal. The latch 121 thereafter transmits the latched EN RAS (3:0) signals at LAT RAS (3:0) latched row address strobe signals.

The LAT RAS (3:0) signals are coupled to one set of input terminals of an OR circuit 124. The OR circuit 124 also has a second set of input terminals connected to receive LAT RAS REF (3:0) latched row address strobe refresh signals from the RAS refresh control portion 113. The OR circuit 124, in response to the LAT RAS (3:0) signals and LAT RAS REF (3:0) signals, generates PRE DRAS (3:0) preliminary signals, which are directed to data input terminals of a latch 126. The latch 126 latches the PRE DRAS (3:0) signals at the next tick of the CLK signal. The latch 126 transmits its latched signals as the DRAS (3:0) signals which it transmits over lines 33(0) through 33(3) to control the respective memory banks 15i(0) through 15i(3). The OR circuit 124 generates each DRAS (i) signal as the logical OR of the corresponding-indexed LAT RAS (i) signal and the LAT RAS REF (i) signal. At this point, the LAT RAS REF (3:0) signals will all be negated, in which case one DRAS (3:0) signal will be asserted, namely, the one DRAS (i) whose index "i" corresponds to the index of the asserted LAT RAS (i) signal.

After the latch 121 has latched the EN RAS (3:0) enable row address strobe signals coupled thereto by multiplexer 125, the read/write control circuit 22 negates the SAMPLE RAS sample row address strobe signal. Since the CLR RAS clear row address strobe signal is also negated, the OR gate 123 is de-energized, which negates the RAS LAT row address strobe signal. The negated RAS LAT signal, in turn, enables the multiplexer 125 to couple the LAT RAS (3:0) latched row address strobe signals, from the data output terminals of latch 121 back to the data input terminals. Accordingly, while the OR gate 123 is de-energized, the multiplexer 125 provides a feedback path to maintains the latch 121 in the same condition in response to successive ticks of the CLK signal.

At some point after it has enabled the RAS access control portion 112 to condition the DRAS (3:0) signals for an access operation, the read/write control portion 22 enables the CAS access control portion 114 to generate the appropriate DCAS (3:0) signals. The CAS access control portion 114 includes a gated driver 130, a latch 131, an inverter 132, an OR gate 133 and a multiplexer 135, connected in the same way as corresponding elements 120 through 123 and 125 in the RAS access control portion 112, as described above. Accordingly, the operation will not be described in detail. The gated driver 130 receives the CAS (3:0) column address strobe signals, one of which, namely, CAS (k), is asserted. The gated driver 130 conditions in response EN CAS (3:0) enable column address strobe signals when a CLR CAS clear column address strobe signal, from the read/write control 22, is negated. Multiplexer 135 couples the EN CAS (3:0) signal to latch 131 when SAMPLE CAS sample column address strobe signal, also from read/write control circuit is asserted. The LAT CAS (3:0) signals are coupled to respective input terminals of an OR circuit 134, which generates the PRE DCAS (3:0) signals much like OR circuit 124 in the RAS access control portion 112 generates the PRE DRAS (3:0) signals. The PRE DCAS (3:0) signals are coupled to data input terminals of a latch 136, which latches them at the next tick of the CLK signal, to provide the DCAS (3:0) signals, which are coupled to the respective memory banks 15i(j).

The read/write control circuit 22 also enables the RAS and CAS access control portions 112 and 114 to negate their LAT RAS (3:0) latched row address strobe and LAT CAS (3:0) latched column address strobe signals at the end of an access operation. This will enable the DRAS (k) and DCAS (k) signals to be negated at the end of the access operation, unless the respective signals are maintained asserted by the respective RAS and CAS refresh control portions 113 and 115. To enable negation of the DRAS (k) signal asserted during an access operation, the read/write control circuit 22 asserts the CLR RAS signal, which disables gated driver 120 to negate the EN RAS (3:0) signals. The assertion of the CLR RAS signal also energizes the OR gate 123, thereby asserting the RAS LAT signal. The asserted RAS LAT signal, in turn, enables multiplexer 125 to couple the negated EN RAS (3:0) signals to the data input terminals of latch 121, which latches them at the next tick of the CLK signal. At this point, the LAT RAS (3:0) latched row address strobe signals will all be negated. When the read/write control circuit 22 later negates the CLR RAS signal, the OR gate 123 negates the RAS LAT signal, which enables the multiplexer 125 to couple the LAT RAS (3:0) signals back to the data input terminals of the latch 121, so that the latch 121 will maintain the LAT RAS (3:0) signals negated at subsequent ticks of the CLK signal. The CAS access control circuit 114 operates similarly in response to the assertion of the CLR CAS clear column address strobe signal by the read/write control circuit.

The read/write control circuit 22 also generates signals for controlling the RAS and CAS refresh control portions 113 and 115 to generate the DRAS (3:0) and DCAS (3:0) signals in the appropriate order to enable memory banks 15i to be refreshed. As noted above, in the embodiment depicted herein, the DRAM control signal generator 43, to enable refresh of a memory bank 15i(j) asserts appropriate DCAS (j) signals before the correspondingly-indexed DRAS (j) signal. In the yellow refresh mode, which occurs contemporaneous with a memory access, to initiate a refresh operation the read/write control circuit 22 negates a SAMPLE CAS RED sample column address strobe red signal, which enables a multiplexer 140 to couple the REF GRNT YELLOW (3:0) refresh grant signals as SEL CAS REF (3:0) selected column address strobe refresh signals to a gated driver 141. As noted above, only one of the REF GRNT YELLOW (3:0) signals is asserted at a time, and so only one of the SEL CAS REF (3:0) selected refresh signals will also be asserted. Alternatively, in the red refresh mode, the read/write control circuit 22 asserts the SAMPLE CAS RED signal, which enables the multiplexer 140 to couple the REF GRNT RED (3:0) signals as the SEL CAS REF (3:0) signals. As noted above, in the red refresh mode, as many as two of the REF GRNT RED (3:0) signals may be asserted at a time, and so as many as two SEL CAS REF (3:0) may also be asserted. It will be appreciated that the read/write control circuit 22 will enable the red refresh mode, and assert the SAMPLE CAS RED signal, if the red refresh grant circuit 91 (FIG. 4) is asserting the REF NOW signal.

In either case, the read/write control circuit 22 also maintains a CLR CAS REF clear column address strobe refresh signal in a negated condition. The CLR CAS REF signal is complemented by an inverter 143 to enable the gated driver 141 to couple the SEL CAS REF (3:0) selected column address strobe refresh signals as EN SEL CAS REF (3:0) enable selected column address strobe signals to data input terminals of a multiplexer 145. In addition, the read/write control circuit asserts a SAMPLE CAS REF sample column address strobe refresh signal, which energizes an OR GATE 144. The energized OR gate 144 negates a REF CAS LAT refresh column address strobe latch signal, which enables a multiplexer 145 to couple the EN SEL CAS REF (3:0) signals to the data input terminal of a latch 142, which latches them in response to the next tick of the CLK signal. The latch 142 latches the signals and couples them as LAT CAS REF (3:0) latched column address strobe refresh signals to one set of input terminals of OR circuit 134. The asserted LAT CAS REF (3:0) signals, that are associated with the memory banks 15i(j) to be refreshed, enables the OR circuit 134 to assert the corresponding ones of the PRE DCAS (3:0) signals. The latch 136 latches the PRE DCAS (3:0) signals at the next tick of the CLK signal, at which point it transmits them as the DCAS (3:0) signals to the memory banks 15i(j). It will be appreciated that this may occur while the CAS access control portion 114 is also asserting selected LAT CAS (3:0) signal to enable a memory access, and so DCAS (3:0) signals may be asserted to reflect both a memory access and a refresh operation. Thereafter, the read/write control circuit 22 may negate the SAMPLE CAS REF sample column address strobe refresh signal. When that occurs, the OR gate is de-energized, negating the REF CAS LAT signal. The negated REF CAS LAT signal enables the multiplexer 145 to couple the LAT CAS REF (3:0) signals from the data output terminal of latch 142 back to its data input terminal, so that the latch 142 maintains the LAT CAS REF (3:0) signals in the same conditions at successive ticks of the CLK signal.

The LAT CAS REF (3:0) signals are also coupled to the RAS refresh control portion 113, particularly to a gated driver 150. The gated driver 150 is controlled by a CLR RAS REF clear row address strobe refresh signal from the read/write control circuit 22, as complemented by an inverter 152. While the read/write control circuit 22 maintains the CLR RAS REF signal in a negated condition, the inverter 152 enables the gated driver 150 to couple the LAT CAS REF (3:0) signals as EN SEL RAS REF (3:0) enable selected row address strobe refresh signals to a data input terminal of a multiplexer 155. After the CAS refresh control portion 115 has suitably conditioned the LAT CAS REF (3:0) signals, the read/write control circuit 22 asserts a SAMPLE RAS REF sample row address strobe refresh signal, which energizes an OR gate 154 to assert a REF RAS LAT refresh row address strobe latch signal. The asserted REF RAS LAT signal enables the multiplexer 155 to couple the EN SEL RAS REF (3:0) signals to the data input terminals of latch 151, which latches them at the next tick of the CLK signal. The latch 151 thereafter transmits the latched signals as LAT RAS REF (3:0) latched row address strobe refresh signals. The LAT RAS REF (3:0) signals are coupled to input terminals of OR circuit 124. The asserted LAT RAS REF (3:0) signals, that are associated with the memory banks 15i(j) to be refreshed, enables the OR circuit 124 to assert the corresponding ones of the PRE DRAS (3:0) signals. The latch 126 latches the PRE DRAS (3:0) signals at the next tick of the CLK signal, at which point it transmits them as the DRAS (3:0) signals to the memory banks 15i(j). It will be appreciated that this may occur while the RAS access control portion 112 is also asserting selected LAT RAS (3:0) signal to enable a memory access, and so DRAS (3:0) signals may be asserted to reflect both a memory access and a refresh operation.

Thereafter, the read/write control circuit 22 may negate the SAMPLE RAS REF signal. In response, the OR gate 154 is de-energized, which negates the REF RAS LAT signal, enabling the multiplexer 155 to couple the LAT RAS REF (3:0) signals from the data output terminal of latch 151 back to its data input terminal, so that the latch 151 maintains the LAT RAS REF (3:0) signals in the same conditions at successive ticks of the CLK signal.

It will be appreciated that, since one LAT CAS REF (3:0) signal is asserted by CAS refresh control portion 115, namely, the LAT CAS REF (j) associated with the memory bank 15i(j) to be refreshed, only the corresponding LAT RAS REF (j) signal will be asserted by RAS refresh control portion 113, thereby enabling the respective latches 163 and 126 to provide the DCAS (j) before DRAS (j) signal combination required to enable a refresh of memory bank 15i(j).

It will further be appreciated that the circuit comprising gated driver 141, latch 142, inverter 143, OR gate 144 and multiplexer 145 of the CAS refresh control portion 115 is generally similar to the elements 120 through 123 and 125 of the RAS access control portion 112. Accordingly, to enable negation of the LAT CAS REF (3:0) signals when their assertion is no longer needed for the refresh operation, the read/write control circuit 22 can negate the SAMPLE CAS REF sample column address strobe signal and assert the CLR CAS REF clear column address strobe refresh signal, which control the gated driver 141, inverter 143, OR gate 144 and multiplexer 145 in the same way as the CLR RAS clear row address strobe signal and SAMPLE RAS sample row address strobe signal control the respective elements of RAS access control circuit 112 as described above. Similarly, the circuit comprising gated driver 150, latch 151, OR gate 154 and multiplexer 155 is also generally similar to the elements 120 through 123 and 125 of the RAS access control portion 112, and the read/write control circuit 22 may also control negation of the LAT RAS REF (3:0) signals. This can be accomplished by negating the SAMPLE RAS REF sample row address strobe refresh signal and asserting the CLR RAS REF clear row address strobe refresh signal, which control the gated driver 150, latch 151, inverter 152, OR gate 154 and multiplexer 155 in the same way as the CLR RAS signal and SAMPLE RAS signal control the respective elements of the RAS access control circuit 112 as described above.

It will be appreciated that the operations described above for refresh operation in the yellow refresh mode occur contemporaneous with a memory access operation. If, however, a refresh operation in the red refresh mode occurs, in response to the asserted REF NOW refresh now signal from refresh grant circuit 42, the refresh operation will not be contemporaneous with a memory access operation. In the red refresh mode, the SAMPLE CAS RED signal is asserted, enabling the multiplexer 140 to couple the REF GRNT RED (3:0) refresh grant red signals as the SEL CAS REF (3:0) selected column address strobe refresh signals. Otherwise, the CAS refresh control portion 115 and RAS refresh control portion 113 operate as described above for a yellow refresh operation.

Refresh as controlled by the DRAM control circuit 23 (FIG. 2) provides a number of benefits. For example, since refresh may be enabled with a memory bank 15i(j) while an access operation, either storage or retrieval, is taking place with another memory bank 15i(k), delays of access operations to accommodate refresh can be minimized. Since access operations can delay processing by the processor, such delays can also be minimized. In particular, memory access delays for refresh will only occur to accommodate refresh in the red refresh mode.

In addition, refresh as controlled by the amount DRAM control circuit 23 minimizes the peak power requirements for the memory 11i. It will be appreciated that, if all of the memory banks 15i in a memory 11i are refreshed concurrently, relatively large amounts of power could be required for the refresh. However, since at most a fraction of the memory banks 15i are refreshed at once, during refresh in the red refresh mode, and that same fraction is refreshed concurrently with a memory access, during a refresh in the yellow refresh mode, the amount of power required for the refresh, or the refresh with memory access, is substantially reduced.

A number of modifications may be made to the memory 11i depicted herein and achieve substantially similar benefits. As described herein, the memory banks 15i essentially maintain their own pointers to identify the next rows of storage locations to be refreshed, thereby relieving the memory controller 14*i* of that requirement. It will be appreciated that the memory controller 14*i* may maintain a refresh counter to provide signals identifying the row of storage locations to be refreshed. The memory controller 14*i* may include either one refresh counter for all of the memory banks, or one refresh counter for each memory bank. In either case, the "CAS before RAS" signal protocol would not be required; instead only the DRAS (*j*) signal would be required for the memory banks 15*i*(*j*) being refreshed at any one time, along with signals from the respective refresh counter(s).

Furthermore, while the memory controller 14*i* has been described as having a single refresh timer 40 for controlling both the yellow flag conditioning circuit 60 and a red flag conditioning circuit 61, it will be appreciated that separate timers may be provided for each circuit 60 and 61.

In addition, while the system bus 13 has been described as having separate lines 24 and 27 for carrying the ADRS address and DATA signals, it will be appreciated that the signals in other embodiments may be multiplexed over the same lines of system bus 13. In that case, the BUS CTRL bus control signals may include an information type control signal provided to identify which type of signals are being transmitted at any particular time. In that embodiment, the BUS CTRL bus control signals will also include a timing signal to indicate when the signals on the bus 13 are valid. The read/write control circuit 22 will receive the information type control signal and timing signal, and enable the address path 21 to latch the ADRS address signals when the information type control signal indicates that the multiplexed lines are carrying them. If the CMD command signals indicate a write operation, the read/write control circuit 22 will also enable the read/write data path 20 to latch the DATA signals comprising the data to be written when the information type control signal indicates that the lines are carrying the DATA signals.

In addition, it will be appreciated that the computer system, as depicted in FIG. 1, may include a number of processors, all of which may be connected to system bus 13.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A memory controller for controlling a memory including a plurality of memory banks, each memory bank including a plurality of storage locations, said memory controller receiving memory access requests over a bus in a digital computer system for initiating a memory access operation in connection with a storage location in a selected bank, said memory controller comprising:

A. a memory access control circuit for (i) receiving memory access requests over the bus and for performing a memory access operation in connection with a storage location in response thereto and (ii) initiating a refresh operation with respect to selected ones of said memory banks;

B. a memory refresh control circuit comprising:
  i. a refresh timer for generating a refresh timing signal to indicate an end of each of a succession of predetermined refresh time intervals;
  ii. a concurrent refresh control circuit connected to said refresh timer and said memory access control circuit for enabling said memory access control circuit to initiate a refresh operation in connection with a selected memory bank following the generation of the refresh timing signal concurrent with the performance by said memory access control circuit of a memory access operation, said concurrent refresh control circuit initiating a refresh operation in connection with a memory bank other than a memory bank with which the memory access control means is performing a memory access operation, said concurrent refresh control circuit maintaining concurrent refresh status information indicating refresh status of each said memory bank; and
  iii. an urgent refresh control circuit connected to said refresh timer, said memory access control circuit and said concurrent refresh control circuit for enabling said memory access control circuit to initiate a refresh operation in response to generation of the refresh timing signal and the concurrent refresh status information maintained by said concurrent refresh control circuit, in connection with a plurality of memory banks with respect to which said concurrent refresh control circuit did not initiate a refresh operation during the preceding timing interval and for concurrently disabling said memory access control means from performing a memory access operation.

2. A memory controller as recited in claim 1 further comprising a memory bank control signal generating circuit for generating memory bank control signals for controlling said memory banks during a memory operation and a refresh operation, A. said memory access control circuit generating a signal identifying a memory bank with which it is performing a memory access operation;

B. said concurrent refresh control circuit includes:
  i. a concurrent refresh status circuit for generating concurrent refresh status indications for said memory banks in response to generation of said timing signal; and
  ii. a concurrent refresh priority circuit for selecting a memory bank with which to initiate a refresh operation in response to the concurrent refresh status indications generated by said concurrent refresh status circuit for said memory banks and the memory bank identified by the signal from said memory access control circuit to thereby identify a memory bank with which a refresh operation is to be performed, said memory bank control signal generating circuit generating memory bank control signals to enable a refresh operation with respect to the identified memory bank.

3. A memory controller as recited in claim 2 in which said concurrent refresh status circuit comprises:

A. a concurrent refresh status flag bank including a plurality of concurrent refresh flags each associated with a memory bank, each concurrent refresh flag having a condition;

B. a concurrent refresh status flag conditioning circuit for establishing the condition of said concurrent refresh flags in response to the refresh timing signal, thereby to identify ones of said memory banks with respect to which a concurrent refresh operation is to take place.

4. A memory controller as recited in claim 3 in which said memory controller generates a plurality of memory bank present signals each having a condition indicating the presence or absence of a memory bank, said concurrent refresh status flag conditioning circuit establishing the condition of each said concurrent refresh flag in response to the condition of the corresponding memory bank present signal and the refresh timing signal.

5. A memory controller as defined in claim 4 in which said concurrent refresh priority circuit generates a concurrent refresh bank grant signal to identify a memory bank to be refreshed, said concurrent refresh status flag conditioning circuit further conditioning the concurrent refresh flags in response to said concurrent refresh bank grant signal.

6. A memory controller as defined in claim 3 in which (i) said memory controller generates a plurality of memory bank present signals each having a condition indicating the presence or absence of a memory bank, (ii) said concurrent refresh priority circuit generates a concurrent refresh bank grant signal to identify a memory bank to be refreshed, and (iii) said concurrent refresh flags each have a set condition to indicate that a concurrent condition is to take place and a reset condition, said concurrent refresh status circuit comprises:
 A. a concurrent refresh set condition enabling circuit for generating a plurality of concurrent refresh set condition enabling signals each associated with a memory bank and corresponding to the condition of the memory bank present signal of the corresponding memory bank in response to said refresh timing signal;
 B. a concurrent refresh reset condition enabling circuit responsive to said concurrent refresh grant signal to generate a plurality of concurrent refresh reset enabling signals each associated with a corresponding memory bank and
 C. a concurrent refresh condition composite enabling circuit for generating a plurality of concurrent refresh condition control signals, each for controlling the conditioning one of said concurrent refresh flags, each of said concurrent refresh condition control signals being generated in response to the concurrent refresh set condition enabling signal in the absence of the concurrent refresh reset enabling signal associated with the corresponding memory bank.

7. A memory controller as defined in claim 2 in which said urgent refresh control circuit includes:
 A. an urgent refresh status circuit for generating urgent refresh status indications for said memory banks in response to generation of said timing signal and the concurrent refresh status indications generated by said concurrent refresh status circuit; and
 B. an urgent refresh priority circuit for selecting a memory bank with which to initiate a refresh operation in response to the urgent refresh status indications generated by said urgent refresh status circuit for said memory banks, said memory bank control signal generating circuit generating memory bank control signals to enable a refresh operation with respect to the identified memory bank.

8. A memory controller as recited in claim 7 in which said urgent refresh status circuit comprises:
 A. an urgent refresh status flag bank including a plurality of urgent refresh flags each associated with a memory bank, each urgent refresh flag having a condition;
 B. an urgent refresh status flag conditioning circuit for establishing the condition of said urgent refresh flags in response to the refresh timing signal, thereby to identify ones of said memory banks with respect to which an urgent refresh operation is to take place.

9. A memory controller as recited in claim 8 in which said memory controller generates a plurality of memory bank present signals each having a condition indicating the presence of a memory bank, said urgent refresh status flag conditioning circuit establishing the condition of each said urgent refresh flag in response to the condition of the corresponding memory bank present signal, the refresh timing signal, and the condition of the concurrent refresh flag associated with the corresponding memory bank.

10. A memory controller as defined in claim 9 in which said urgent refresh priority circuit generates an urgent refresh bank grant signal to identify a memory bank to be refreshed, said urgent refresh status flag conditioning circuit further conditioning the urgent refresh flags in response to said urgent refresh bank grant signal.

11. A memory controller as defined in claim 8 in which (i) said memory controller generates a plurality of memory bank present signals each having a condition indicating the presence of a memory bank, (ii) said urgent refresh priority circuit generates an urgent refresh bank grant signal to identify a memory bank to be refreshed, and (iii) said urgent refresh flags each have a set condition to indicate that an urgent condition is to take place and a reset condition, said urgent refresh status circuit comprises:
 A. an urgent refresh set condition enabling circuit for generating a plurality of urgent refresh set condition enabling signals each associated with a memory bank and corresponding to the condition of the memory bank present signal of the corresponding memory bank in response to said refresh timing signal and the condition of the concurrent refresh flag of the associated memory bank;
 B. an urgent refresh reset condition enabling circuit responsive to said urgent refresh grant signal to generate a plurality of urgent refresh reset enabling signals each associated with a corresponding memory bank and
 C. an urgent refresh condition composite enabling circuit for generating a plurality of composite urgent refresh condition enabling signals, each for conditioning one of said urgent refresh flags, each of said composite urgent refresh condition enabling signals being generated response to the urgent refresh set condition enabling signal and the urgent refresh reset enabling signal associated with the corresponding memory bank.

12. A method for operating a memory controller for controlling a memory including a plurality of memory banks, each memory bank including a plurality of storage locations, said memory controller receiving memory access requests over a bus in a digital computer system for initiating a memory access operation in connection with a storage location in a selected bank, said method comprising the steps of:

A. receiving memory access requests over the bus and performing a memory access operation in connection with a storage location in response thereto;

B. generating a timing signal to indicate an end of each of a succession of predetermined time intervals;

C. initiating a concurrent refresh operation in connection with a selected memory bank following the generation of the timing signal concurrent with the performance of a memory access operation, the concurrent refresh operation being initiated in connection with a memory bank other than a memory bank with which the memory access operation is being performed, and maintaining concurrent refresh status information indicating refresh status of each said memory bank; and D. determining in response to a timing signal and the concurrent refresh status information the refresh status of each said memory bank and initiating an urgent refresh operation in response to generation of the timing signal in connection with a memory bank which was not refreshed by concurrent refresh operations during the preceding timing interval, and disabling said memory access operations during a said urgent refresh operation.

* * * * *